(12) United States Patent
Cheng et al.

(10) Patent No.: US 11,212,903 B2
(45) Date of Patent: Dec. 28, 2021

(54) APPARATUS AND METHOD FOR GENERATING EXTREME ULTRAVIOLET RADIATION

(71) Applicant: TAIWAN SEMICONDUCTOR MANUFACTURING CO., LTD., Hsinchu (TW)

(72) Inventors: Ting-Ya Cheng, Hsinchu (TW); Chun-Lin Chang, Zhubei (TW); Li-Jui Chen, Hsinchu (TW); Han-Lung Chang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 79 days.

(21) Appl. No.: 16/551,294

(22) Filed: Aug. 26, 2019

(65) Prior Publication Data
US 2020/0075190 A1 Mar. 5, 2020

Related U.S. Application Data

(60) Provisional application No. 62/725,931, filed on Aug. 31, 2018.

(51) Int. Cl.
| | |
|---|---|
| *H05G 2/00* | (2006.01) |
| *G02B 7/185* | (2021.01) |
| *G02B 26/06* | (2006.01) |
| *G02B 26/08* | (2006.01) |
| *G02B 27/09* | (2006.01) |
| *G03F 7/20* | (2006.01) |

(52) U.S. Cl.
CPC ............ *H05G 2/008* (2013.01); *G02B 7/185* (2013.01); *G02B 26/06* (2013.01); *G02B 26/0858* (2013.01); *G02B 27/0933* (2013.01); *G02B 27/0977* (2013.01); *G03F 7/70033* (2013.01); *H05G 2/005* (2013.01)

(58) Field of Classification Search
CPC ...................................................... G03F 7/70
See application file for complete search history.

(56) References Cited

U.S. PATENT DOCUMENTS

| | | | |
|---|---|---|---|
| 8,681,427 B2* | 3/2014 | Bergstedt | ............ G02B 27/141 |
| | | | 359/634 |
| 8,796,666 B1 | 8/2014 | Huang et al. | |
| 8,847,181 B2* | 9/2014 | Moriya | .................. H05G 2/008 |
| | | | 250/504 R |
| 9,093,530 B2 | 7/2015 | Huang et al. | |
| 9,134,633 B2 | 9/2015 | Lin et al. | |
| 9,230,867 B2 | 1/2016 | Cheng et al. | |
| 9,304,403 B2 | 4/2016 | Lin et al. | |
| 9,360,600 B2* | 6/2016 | Pate | .................... G02B 26/0825 |
| 9,363,878 B2* | 6/2016 | Moriya | ................. H01S 3/0071 |

(Continued)

*Primary Examiner* — Thomas R Artman
(74) *Attorney, Agent, or Firm* — McDermott Will & Emery LLP

(57) ABSTRACT

An apparatus for generating extreme ultraviolet (EUV) radiation includes a droplet generator configured to generate target droplets. An excitation laser is configured to heat the target droplets using excitation pulses to convert the target droplets to plasma. A deformable mirror is disposed in a path of the excitation laser. A controller is configured to adjust parameters of the excitation laser by controlling the deformable mirror based on a feedback parameter.

20 Claims, 15 Drawing Sheets

(56) References Cited

U.S. PATENT DOCUMENTS

| | | | |
|---|---|---|---|
| 9,386,675 B2* | 7/2016 | Suzuki | G02B 27/0068 |
| 9,404,743 B2 | 8/2016 | Chiu et al. | |
| 9,548,303 B2 | 1/2017 | Lee et al. | |
| 9,823,585 B2 | 11/2017 | Shih et al. | |
| 9,835,950 B2* | 12/2017 | Eurlings | G02B 19/0019 |
| 9,841,687 B2 | 12/2017 | Lee et al. | |
| 9,859,139 B2 | 1/2018 | Cheng et al. | |
| 2012/0228525 A1* | 9/2012 | Moriya | H05G 2/008 250/504 R |
| 2013/0119232 A1* | 5/2013 | Moriya | G03F 7/70258 250/201.1 |
| 2013/0321926 A1* | 12/2013 | Bergstedt | G02B 27/141 359/634 |
| 2015/0123018 A1* | 5/2015 | Moriya | G01J 1/429 250/504 R |
| 2015/0137011 A1* | 5/2015 | Pate | H05G 2/008 250/504 R |
| 2015/0264792 A1* | 9/2015 | Suzuki | H05G 2/008 250/504 R |
| 2015/0334814 A1* | 11/2015 | Moriya | G03F 7/70033 250/504 R |
| 2016/0334711 A1* | 11/2016 | Eurlings | H05G 2/005 |
| 2020/0075190 A1* | 3/2020 | Cheng | G02B 7/185 |

* cited by examiner

FIG. 2B
FIG. 2C
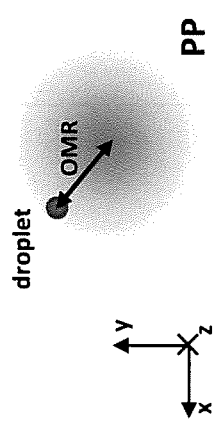
FIG. 2D
FIG. 2E

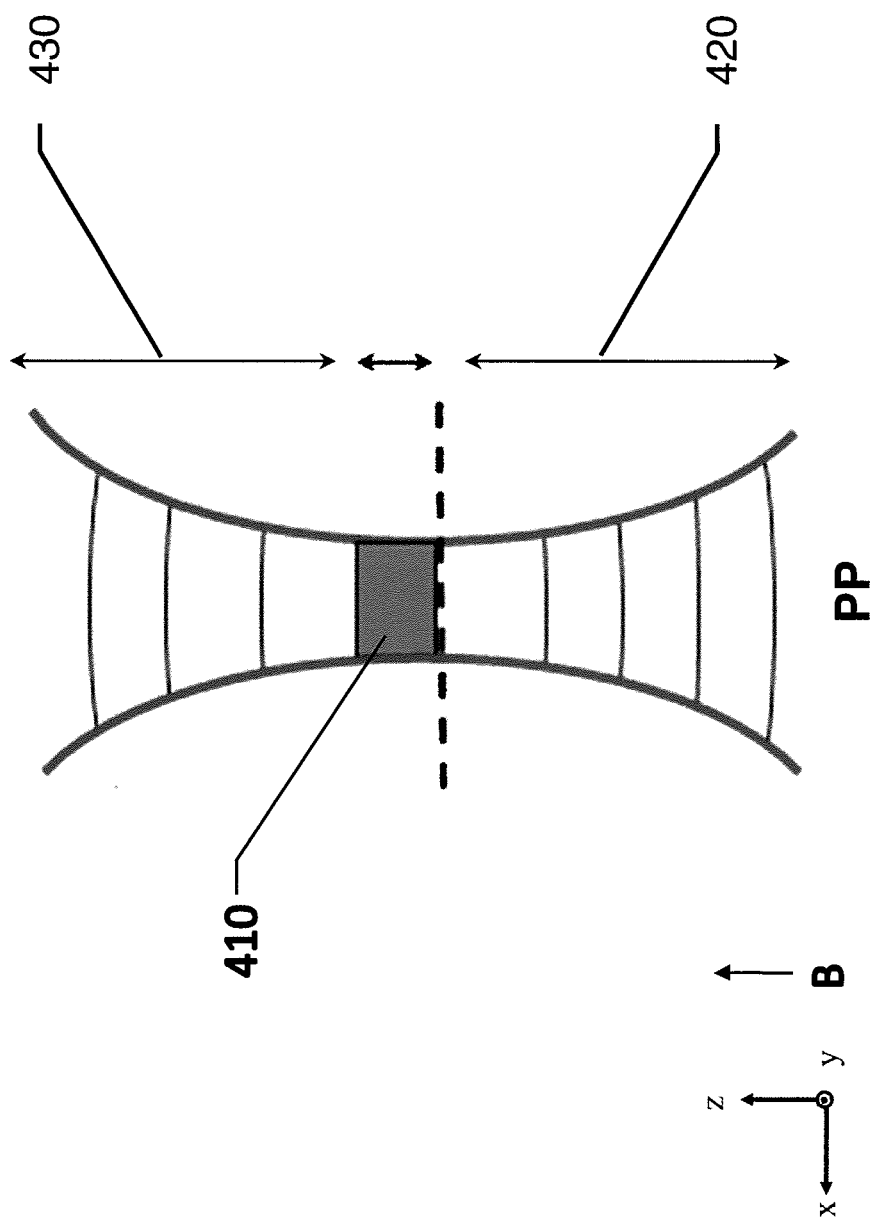

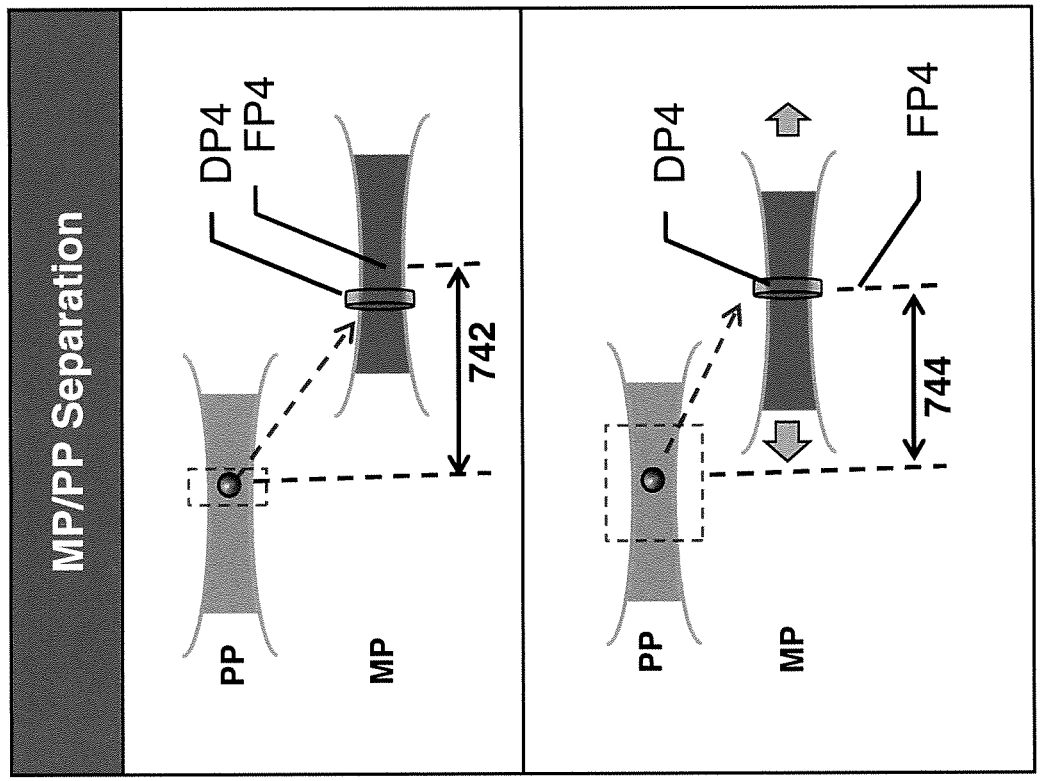

APPARATUS AND METHOD FOR GENERATING EXTREME ULTRAVIOLET RADIATION

CROSS REFERENCE TO RELATED APPLICATION

This application claims the priority of U.S. Provisional Application No. 62/725,931 filed on Aug. 31, 2018, the entire content of which application is incorporated herein by reference.

BACKGROUND

The demand for computational power has increased exponentially. This increase in computational power is met by increasing the functional density, i.e., number of interconnected devices per chip, of semiconductor integrated circuits (ICs). With the increase in functional density, the size of individual devices on the chip has decreased. The decrease in size of components in ICs has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

One method for producing EUV radiation is laser-produced plasma (LPP). In an LPP based EUV source a high-power laser beam is focused on small tin droplet targets to form highly ionized plasma that emits EUV radiation with a peak maximum emission at 13.5 nm. The intensity of the EUV radiation produced by LPP depends on the effectiveness with which the high-powered laser can produce the plasma from the droplet targets. Synchronizing the pulses of the high-powered laser with generation and movement of the droplet targets can improve the efficiency of an LPP based EUV radiation source.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2B, 2C, 2D, 2E, and 2F schematically illustrate the movement of target droplet by the pre-pulse in X-Z and X-Y planes respectively.

FIG. 3 schematically illustrates a position where a pre-pulse from an excitation laser meets a target droplet for providing optimum expansion of target droplet before moving toward a position of focal point of a main pulse of the excitation laser.

FIGS. 8A and 8B schematically illustrates a MPPP separation that can be controlled by replacing one of the mirror in the light path of the excitation laser with a selectively detachable deformable mirror in accordance with an embodiment.

DETAILED DESCRIPTION

Figure 1:
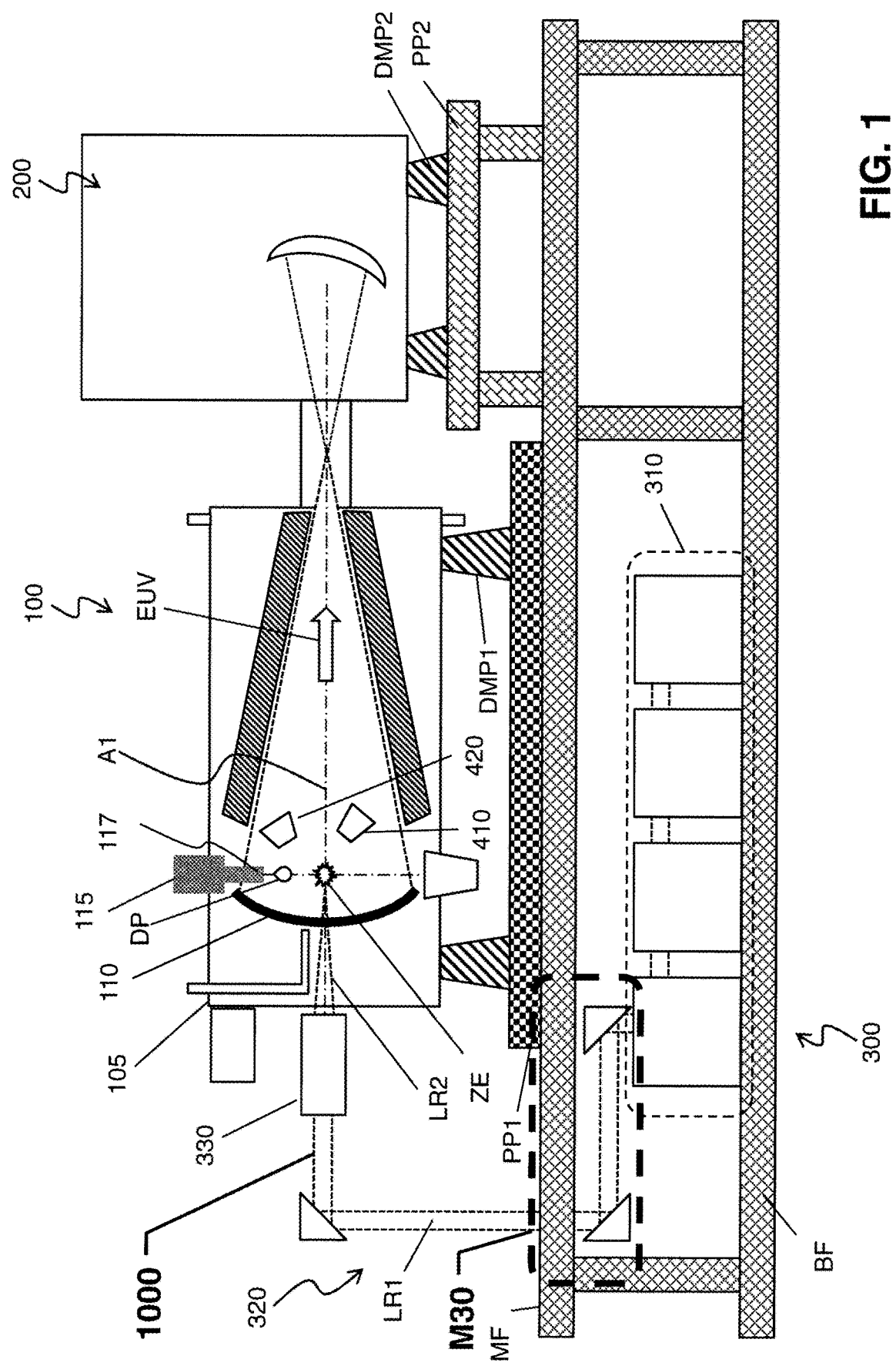
FIG. 1 is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to extreme ultraviolet (EUV) lithography systems and methods. More particularly, it is related to apparatuses and methods for controlling an excitation laser used in a laser produced plasma (LPP) based EUV radiation source. The excitation laser heats metal (e.g., tin) target droplets in the LPP chamber to ionize the droplets to a plasma which emits the EUV radiation. For optimum heating of the target droplets, the target droplets have to arrive at the focal point of the excitation laser at the same time as an excitation pulse from the excitation laser. Thus, synchronization between the target droplets and trigger time for triggering an excitation pulse from the excitation laser contributes to efficiency and stability of the LPP EUV radiation source. One of the objectives of the present disclosure is directed to controlling the excitation laser to provide optimum heating of target droplets.

FIG. 1 is a schematic view of an EUV lithography system with a laser production plasma (LPP) based EUV radiation source, constructed in accordance with some embodiments of the present disclosure. The EUV lithography system includes an EUV radiation source 100 to generate EUV radiation, an exposure tool 200, such as a scanner, and an excitation laser source 300. As shown in FIG. 1, in some embodiments, the EUV radiation source 100 and the exposure tool 200 are installed on a main floor MF of a clean room, while the excitation laser source 300 is installed in a base floor BF located under the main floor MF. Each of the EUV radiation source 100 and the exposure tool 200 are placed over pedestal plates PP1 and PP2 via dampers DMP1 and DMP2, respectively. The EUV radiation source 100 and the exposure tool 200 are coupled to each other by a coupling mechanism, which may include a focusing unit.

The lithography system is an extreme ultraviolet (EUV) lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. In an embodiment, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP collector 110, enclosed by a chamber 105. The target droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 µm or 10.6 µm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as "pre-pulse") is used to heat (or pre-heat) a given target droplet to create a low-density target plume with multiple smaller droplets, which is subsequently heated (or reheated) by a pulse from the main laser, generating increased emission of EUV.

In various embodiments, the pre-heat laser pulses have a spot size about 100 µm or less, and the main laser pulses have a spot size in a range of about 150 µm to about 300 µm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplet DP in an embodiment.

The laser light LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure tool 200.

The position of the zone of excitation ZE and parameters such as laser power, main pulse to pre-pulse delay, position of the pre-pulse focus, etc. are determined at the time the radiation source 100 is set up. The actual position of the zone of excitation ZE and parameters such as power and timing are then adjusted during wafer exposure using a feedback mechanism in various embodiments. However, these parameters change over time because of factors such as, for example, laser drift, instability in the droplet generator, and changes in chamber environment.

Figure 2A:
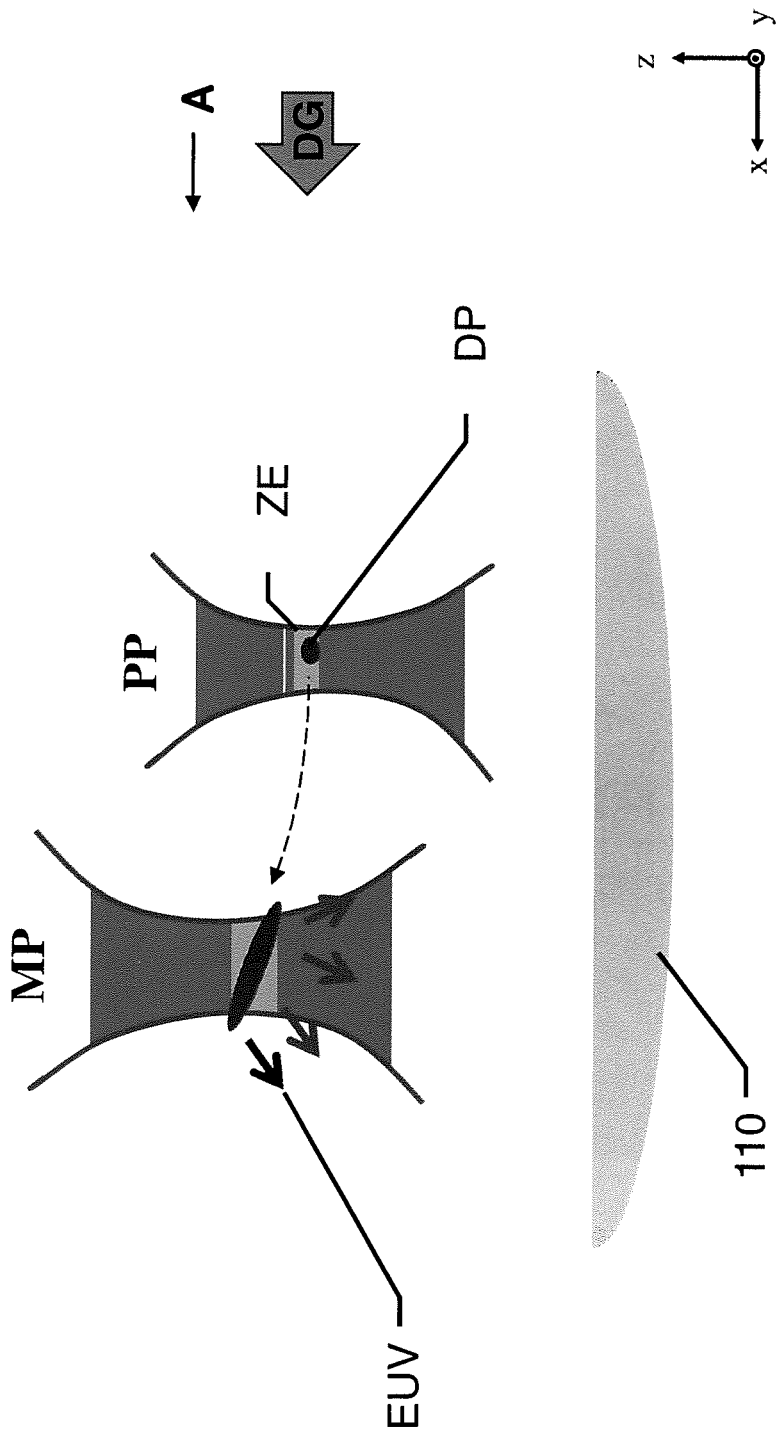
FIG. 2A schematically illustrates the movement of target droplet relative to the collector after being irradiated by the pre-pulse in X-Z plane.

FIG. 2A schematically illustrates the movement of target droplet DP relative to the collector 110 after being irradiated by the pre-pulse PP. A target droplet DP is sequentially irradiated by the pre-pulse PP and the main pulse MP. When the target droplet DP travels along X-axis in a direction "A" from the droplet generator DG to the zone of excitation ZE, the pre-pulse PP exposing the target droplet DP causes the target droplet DP to change its shape into, for example, a pancake and introduces a Z-axis component to its direction of travel in the X-Z plane.

The laser-produced plasma (LPP) generated by irradiating the target droplet DP with the laser beams PP, MP presents certain timing and control problems. The laser beams PP, MP must be timed so as to intersect the target droplet DP when it passes through the targeted point. The laser beams PP, MP must be focused on each of their focus positions, respectively, where the target droplet DP will pass. The position of the zone of excitation ZE and parameters such as, for example, laser power, time delay between the main pulse and the pre-pulse, focal point of the pre-pulse and/or main pulse, may be determined when an EUV radiation source 100 is set up. The actual position of the zone of excitation ZE and the afore-mentioned parameters are then adjusted during wafer exposure using a feedback mechanism in various embodiments. However, these parameters can change over time due to various factors such as, for example, mechanical and/or electrical drift in the radiation source, instability of the droplet generator, and changes in chamber environment.

FIG. 2B illustrates an exemplary optical metrology for misalignment in the x-axis OMX. OMX is defined by a distance in the x-axis between a droplet and the focal point of the pre-pulse PP. Similarly, FIG. 2C illustrates an exemplary optical metrology for misalignment in the y-axis OMY. OMY is defined by a distance in the y-axis between the droplet and the focal point of the pre-pulse PP. FIG. 2D further illustrates an exemplary optical metrology for misalignment in the z-axis OMZ. Similar to OMX and OMY, OMZ is defined by a distance in the z-axis between a droplet and the focal point of the pre-pulse PP. FIG. 2E illustrates an exemplary optical metrology for misalignment in radius OMR. The x-axis is in the direction of motion by the droplet from the droplet generator 115. The z-axis is along the optical axis A1 of the collector mirror 110. The y-axis is perpendicular to the x-axis and the z-axis.

Figure 2F:
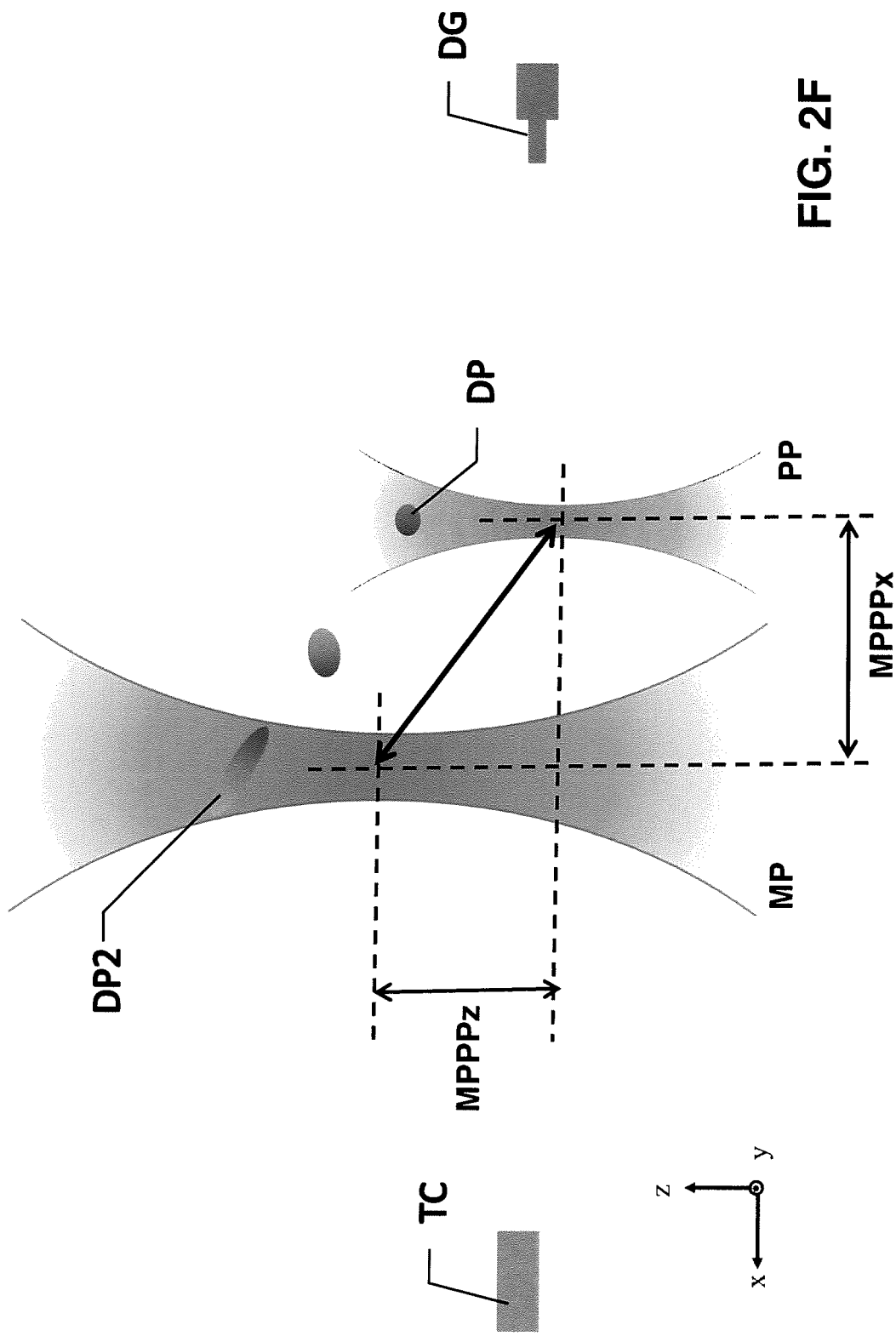

As shown in FIG. 2F, the target droplet DP is ejected from a droplet generator travelling in a direction to a tin catcher TC. When such mechanical and/or electrical drift occurs in the radiation source, the pre-pulse laser PP causes the target droplet DP to expand in a direction with an angle with respect to a direction of incidence from the pre-pulse laser beam. This gives a rise to a target droplet DP2 which has expanded to form a football-like shape shown in FIG. 2C. In such an embodiment, a spatial separation between the pre-pulse PP and the main-pulse MP, MPPP separation, is defined as a distance between the focal point of the pre-pulse PP and the focal point of the main-pulse MP, which is a 3-D vector contributed by x, y, and z sections. For example, as shown in FIG. 2F, MPPPx is a distance along the x-axis of the MPPP separation and MPPPz is a distance along the z-axis of the MPPP separation.

FIG. 3 schematically illustrates a window of operation 410 for the pre-pulse PP that can provide optimum EUV performance. In some embodiments, the pre-pulse PP irradiates along Z-axis in a direction "B" and hits the target droplet within the window of operation 410, then the pre-pulse laser PP provides optimum EUV performance. In some embodiments, the pre-pulse PP hits the target droplet within a first outside portion of the window 420 causing the droplet to drop out faster, thereby resulting in insufficient expansion of the target droplet for the main pulse. In some embodiments, the pre-pulse PP hits the target droplet within a second outside portion of the window 430 causing the target droplet to travel out of a projected path resulting in two peaks of the EUV output (i.e., T-fire bi-model). The target droplet irradiated by the pre-pulse PP within both outside portions of the window 420, 430 results in degraded EUV performance allowing a dose error, a distortion of the EUV wavefront, inefficient operation, reduced EUV power, contamination of the chamber and/or collector from tin droplets, etc.

To overcome the aforementioned deficiencies, positioning of the pre-pulse PP and/or the main pulse MP needs to be controlled accurately. A feedback control loop to control positioning of the excitation zone and/or to synchronize the position of the excitation zone with the position of the pre-pulse and/or main pulse from the laser is desirable. Such a control loop available would require an in-line mechanism to adjust the focal position of the excitation laser to move within the window of operation 410 without having to disassemble the laser from the source.

Figure 5A:
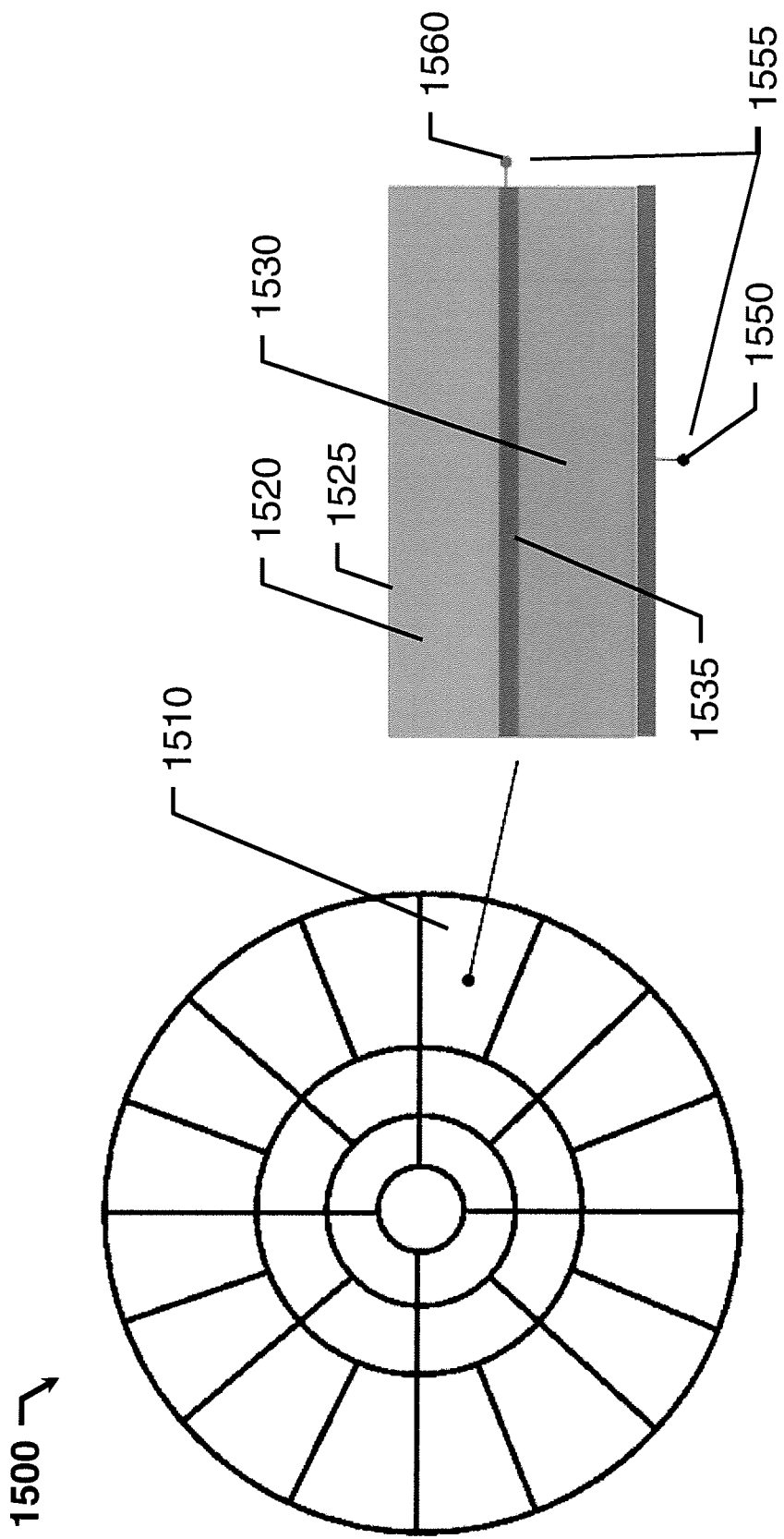
FIG. 5A schematically illustrates detailed views of the selectively detachable deformable mirror assembly.

An embodiment of the disclosure is an apparatus including one or more mirrors in the path of the excitation laser that can be replaced with a selectively detachable deformable mirror shown in FIG. 5A (rather than a steerable mirror which may have a delay in correction). In such an embodiment, the parameter of controlling the deformable mirror is at least one selected from the group consisting of a beam size, the distance along the z-axis of the MPPP separation, and a distorted wavefront aberration. The in-line feedback/optimization disclosed herein provides a more stable plasma generation and thereby more stable EUV radiation. The stable plasma generation prevents excessive contamination of the collector mirror and other parts of the chamber. Moreover, the stable EUV radiation reduces dose error during lithography, thereby improving the throughput of the lithography system.

Figure 4:
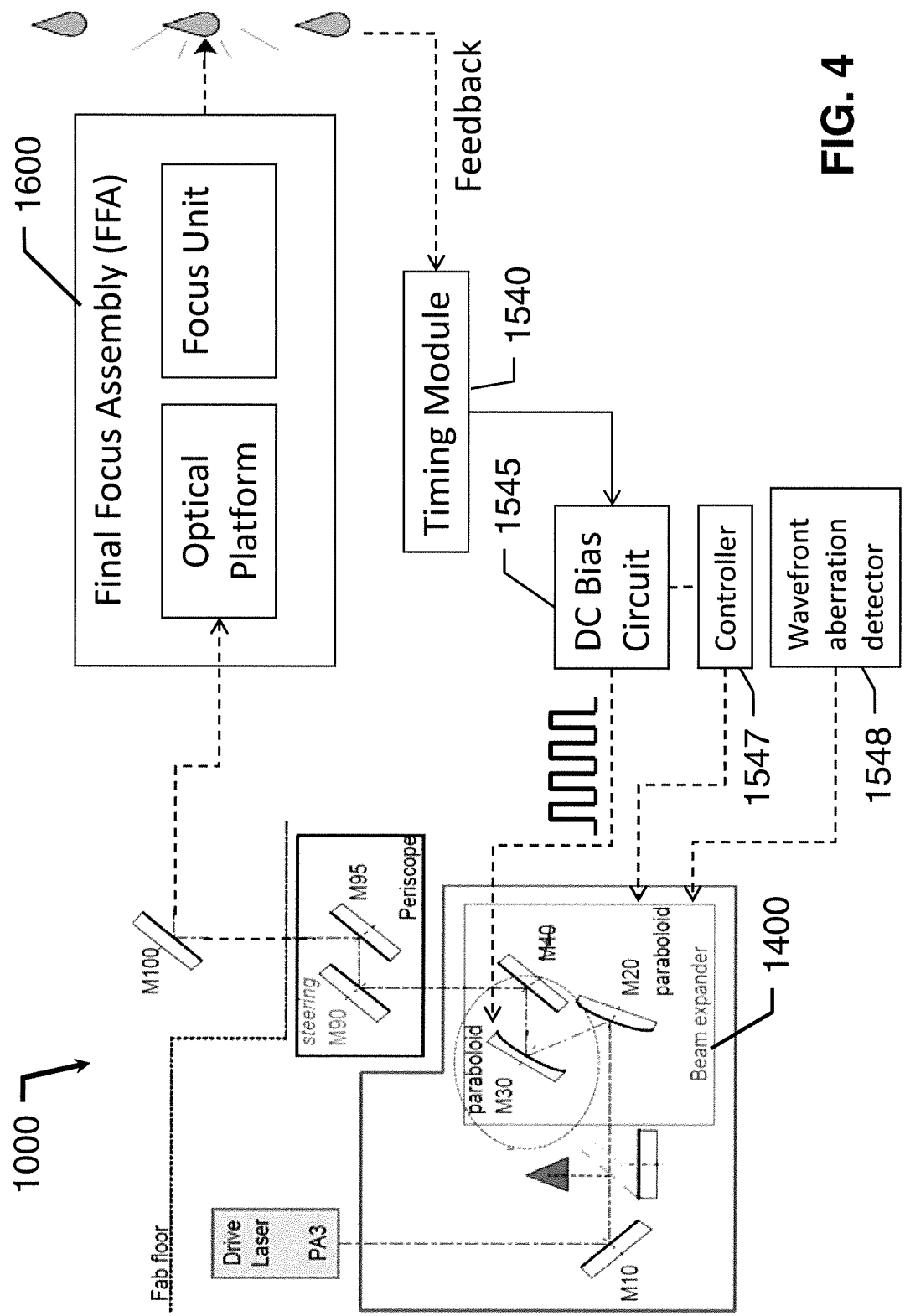
FIG. 4 schematically illustrates an installation of a selectively detachable deformable mirror assembly within the EUV lithography system.

Referring to FIG. 4, the laser beam (e.g. PP, MP) amplified by one or more power amplifiers PA3 is reflected by various reflective optics disposed in a beam transport system 1000. The beam transport system 1000 is located under the floor of the fabrication process ("fab floor") and includes an in-line beam expander 1400 and a final focus assembly 1600. The final focus assembly 1600 also includes an optical platform and a focus unit. In some embodiments, the in-line beam expander 1400 includes one or more paraboloid mirrors such as, for example, M20, M30 mirrors. Any reflective optical mirror can be replaced with the selectively detachable deformable mirror. Detachable mirrors are used so that any mirror in the optical system can be replaced by a deformable mirror. In some embodiments, the M30 mirror in the beam expander 1400 is replaced by the deformable mirror due to its ease of access.

In some embodiments, a pulse timing module 1540 provides electric power to the isolated deformable regions 1510 via a DC bias circuit 1545 and controls the modulating frequency. In some embodiments, the DC bias circuit 1545 provides a biasing DC voltage to the selectively detachable deformable mirror assembly 1500. In some embodiments, the DC bias circuit 1545 delays the biasing DC voltage. In some embodiments, the DC bias circuit 1545 is connected to a controller 1547 and the biasing DC voltage is controlled by the controller. In other embodiments, the in-line beam expander 1400 provides an electrical field to the reflective surface and/or the back surface of the selectively detachable deformable mirror assembly 1500. In some embodiments, the in-line beam expander 1400 is also connected with an wavefront aberration detector 1548, which will be described in later in this disclosure.

As shown in FIG. 5A, a selectively detachable deformable mirror assembly 1500 includes isolated deformable regions 1510. Each of the isolated deformable regions 1510 includes a glass substrate 1520 with a reflective coating 1525 disposed over the glass substrate 1520 and a piezo crystal 1530 separated by an adhesive material 1535. Piezoelectric materials, such as the piezo crystal 1530, are materials that can produce electricity due to a mechanical stress, such as compression. These materials can also deform when voltage (electricity) is applied. Some examples of piezoelectric materials are PZT (also known as lead zirconate titanate), barium titanate, and lithium niobate. These man-made materials have a more pronounced effect (better material to use) than quartz and other natural piezoelectric materials. Each of the isolated deformable regions 1510 also includes a first electrode 1550 having an electrical potential V+ arranged in the selectively detachable deformable mirror assembly 1500. In some embodiments, isolated deformable regions 1510 may include one or more second electrodes 1560 having an electrical potential V− arranged in the selectively detachable deformable mirror assembly 1500. In some embodiments, the electrical potential V+ at the first electrode 1550 is higher than the electrical potential V− at the second electrodes 1560. In some embodiments, two or more of the second electrode 1560 of the isolated deformable regions 1510 are connected together at a common ground potential. In some embodiments, the second electrodes 1560 of the isolated deformable regions 1510 are separated from one another.

In some embodiments, the isolated deformable regions 1510 of the selectively detachable deformable mirror assembly 1500 are provided with a voltage in a range from about 1 Vdc to about 200 Vdc. In some embodiments, the isolated deformable regions 1510 are provided with an electric potential equal to 5 V, 10V, 20 V, 25 V, 50 V, 100V, 150V, or any other potential between any two of these values. Based on the electrical potential difference between the first and second electrodes 1550, 1560, each of the isolated deformable regions 1510 changes a shape such as, for example, a convex or concave shape.

Figure 5B:
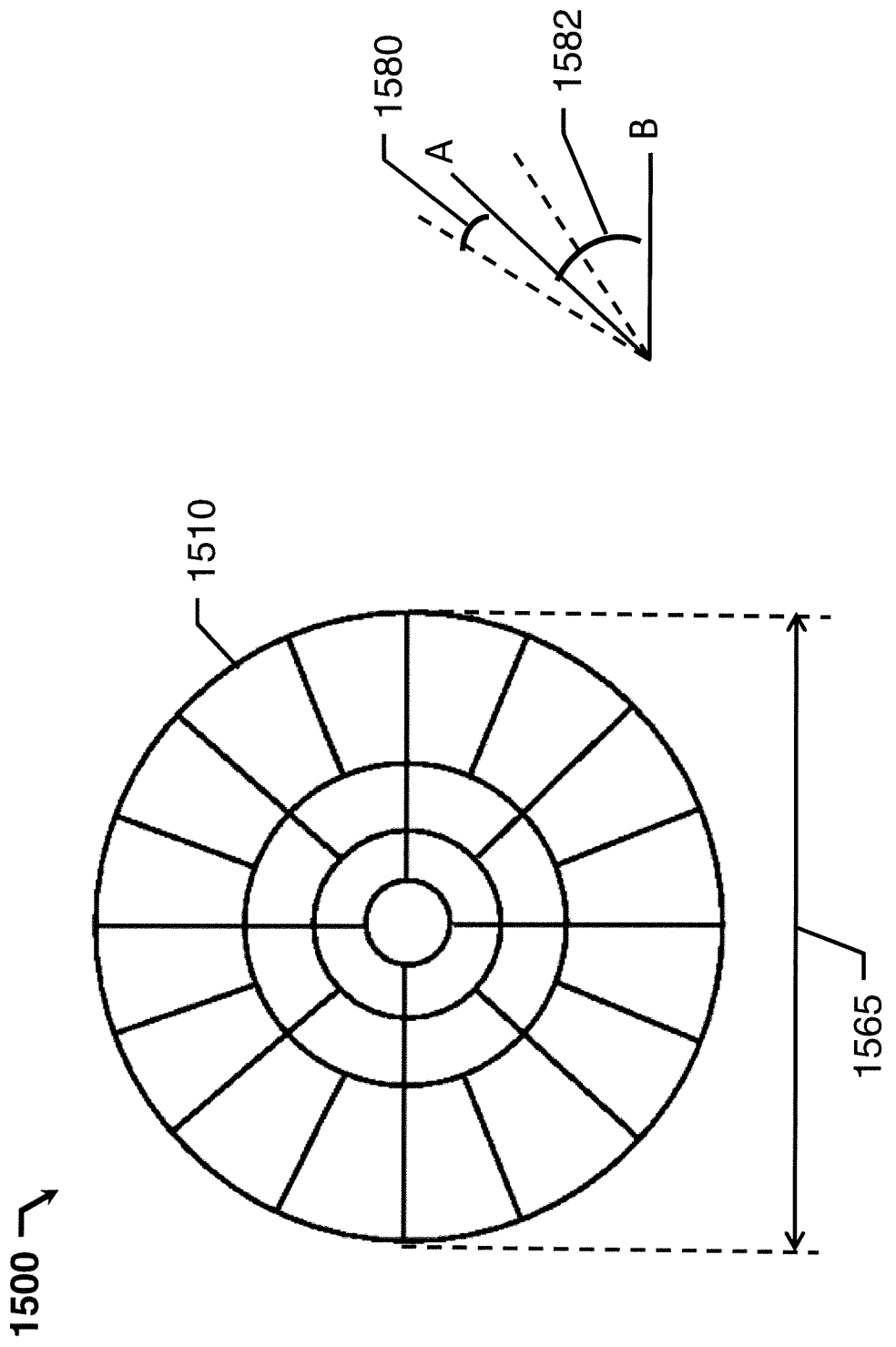
FIG. 5B schematically illustrates a mechanical dimension and controllable parameter of the selectively detachable deformable mirror assembly

In some embodiments, as shown in FIG. 5B, the selectively detachable deformable mirror assembly 1500 is provided with a diameter 1565 in a range from about 13 cm to about 17 cm. In some embodiments, the isolated deformable regions 1510 of the selectively detachable deformable mirror assembly 1500 are provided with an adjustable tilt angle 1580 (from a surface of the isolated deformable regions 1510 "A") with respect an initial tilt angle 1582 (between the surface of the isolated deformable regions 1510 "A" and a horizontal plane parallel to an entire deformable mirror "B") in a range from about −2.0 mrad to about +2.0 mrad.

A specific surface shape can be generated by a set of electric potentials 1555 and the tilt angle 1580 applied to the isolated deformable regions 1510. The specific surface shape allows the selectively detachable deformable mirror assembly 1500 to form a surface profile to overcome the deficiencies described above causing the degraded EUV performance such as the dose error, the distortion of the EUV wavefront, the reduced EUV power, the contamination of the chamber and/or collector from tin droplets. Further, by modulating the voltage, it is possible to create a wavefront profile that allows the wavefront aberration to be rapidly corrected by the selectively detachable deformable mirror assembly 1500. In some embodiments, the selectively detachable deformable mirror assembly 1500 is configured such that a desired/calibration profile of the wavefront aberration may be generated after the wavefront sensor 1548 (wavefront aberration detector in FIG. 4) measures the wavefront aberration. In some embodiments, the calibration profile can be used in-line so that the wavefront error can be compensated in-line by the selectively detachable deformable mirror assembly 1500 during EUV radiation source operation.

Figure 5C:
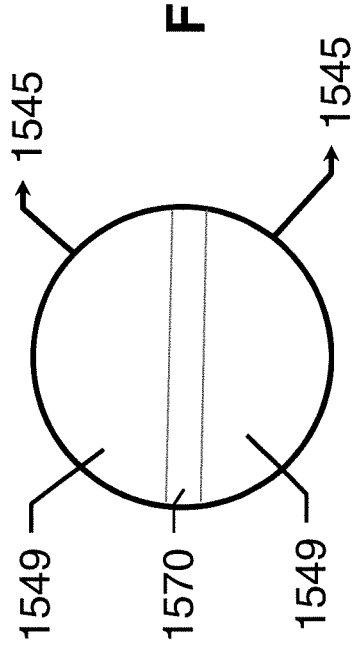
FIGS. 5C, 5D, and 5E are detailed views of various isolated deformable regions of the selectively detachable deformable mirror assembly.
Figure 5E:
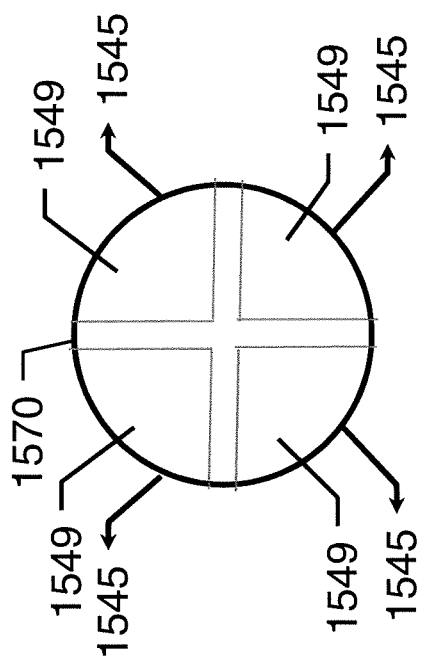
Figure 5D:
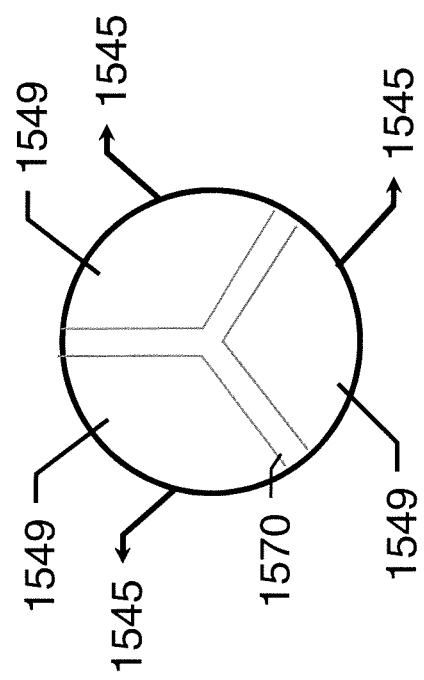

In some alternative embodiments shown in FIGS. 5C, 5D and 5E, the selectively detachable deformable mirror assembly 1500 includes different arrangements of the isolated deformable regions 1510 on the selectively detachable deformable mirror assembly 1500. The isolated deformable regions 1510 are separated by electrically insulating regions 1570 and are connected to the DC biasing circuit 1545.

In one or more embodiments, as shown in FIG. 4, the selectively detachable deformable mirror assembly 1500 includes a plurality of electrically isolated electrodes 1580 connected to the DC biasing circuit 1545. While the specific arrangement are provided for the electrodes disclosed above, these are merely exemplary embodiments and the present system may utilize any appropriate configuration of the selectively detachable deformable mirror assembly 1500. Further, depending upon the application of the present system, specific capabilities of the foregoing electrodes may be required. These various configurations may be contemplated by the present disclosure.

Figure 6:
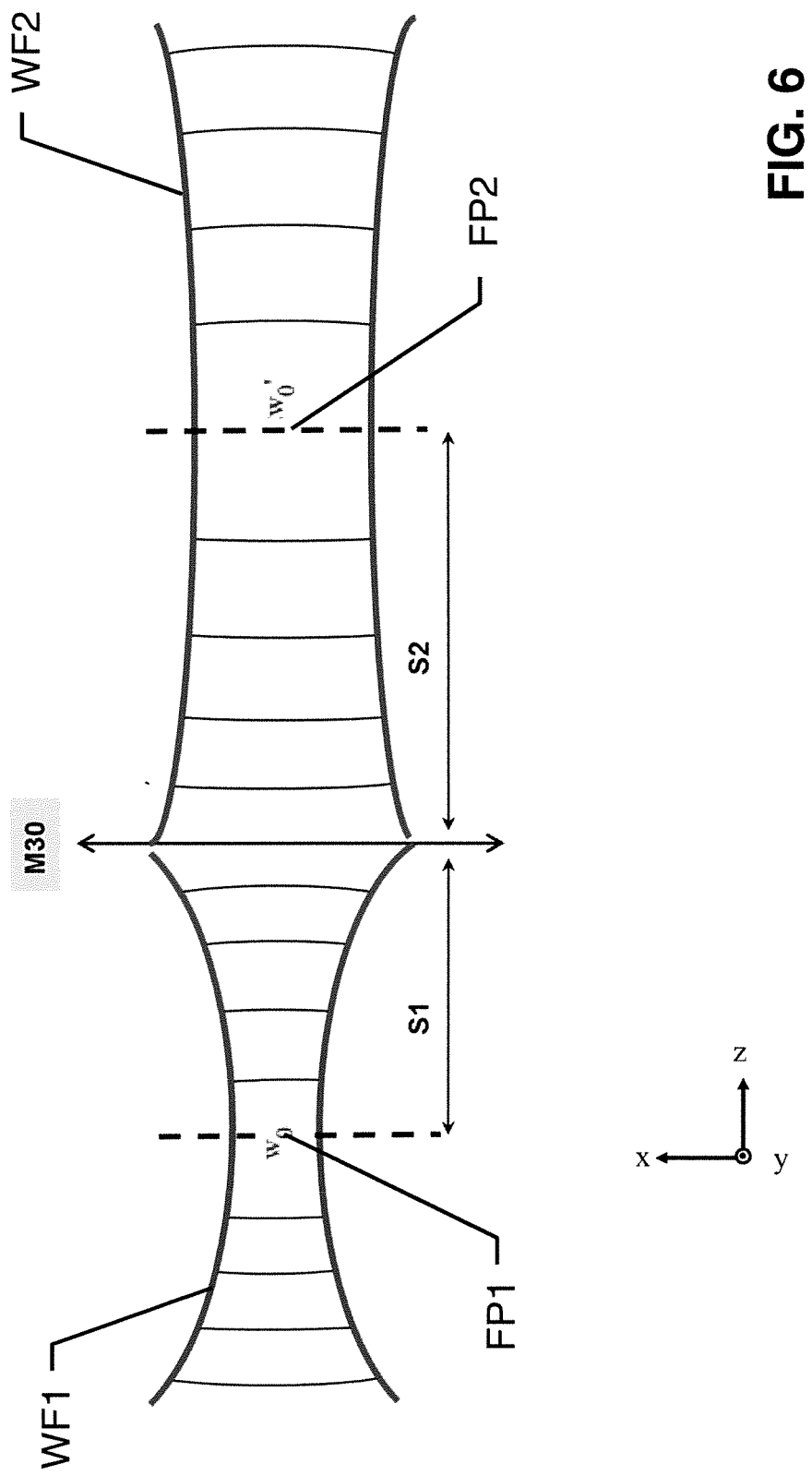
FIG. 6 schematically illustrates how a beam profile can be controlled and/or optimized using a selectively detachable deformable mirror in accordance with an embodiment.

FIG. 6 schematically illustrates an exemplary optical metrology for adjusting various wavefront parameters after replacing one or more mirrors in the system, e.g. the M30 mirror (see FIG. 4), with selectively detachable deformable mirror assembly 1500 in accordance with an embodiment. A focal length and a beam waist of the laser beam are key factors for controlling the selectively detachable deformable mirror assembly 1500. In FIG. 6, S1 is defined by a distance along the z-axis between a first focal point FP1 of a first wavefront WF1 to the plane of the M30 mirror. Similarly, S2 is defined by a distance along the z-axis between the plane of the M30 mirror and a second focal point FP2 of a second wavefront WF2. A first beam waist $\omega_0$ is defined by the smallest diameter at the first focal point FP1 of the first wavefront WF1. Similarly, $\omega'_0$ is a second beam waist, the smallest diameter at the second focal point FP2 of the second wavefront WF2. Particularly, the second beam waist $\omega'_0$ can be expressed by Equation 1:

$$\omega'_0 = \frac{\lambda_0 f}{n\pi\omega_0} \frac{1}{\sqrt{1 + \frac{f^2}{Z_R^2}}}, \qquad \text{(Equation 1)}$$

wherein, $\lambda_0$ is a wavelength of the excitation laser, f is a focus length, and $Z_R$ is a Rayleigh length.

FIGS. 7A, 7B, 8A, 8B, 9A and 9B schematically illustrate various parameters that can be controlled by replacing one of the mirrors in the light path of the excitation laser with a selectively detachable deformable mirror in accordance with some embodiments of the present disclosure.

Figures 7A, 7B:
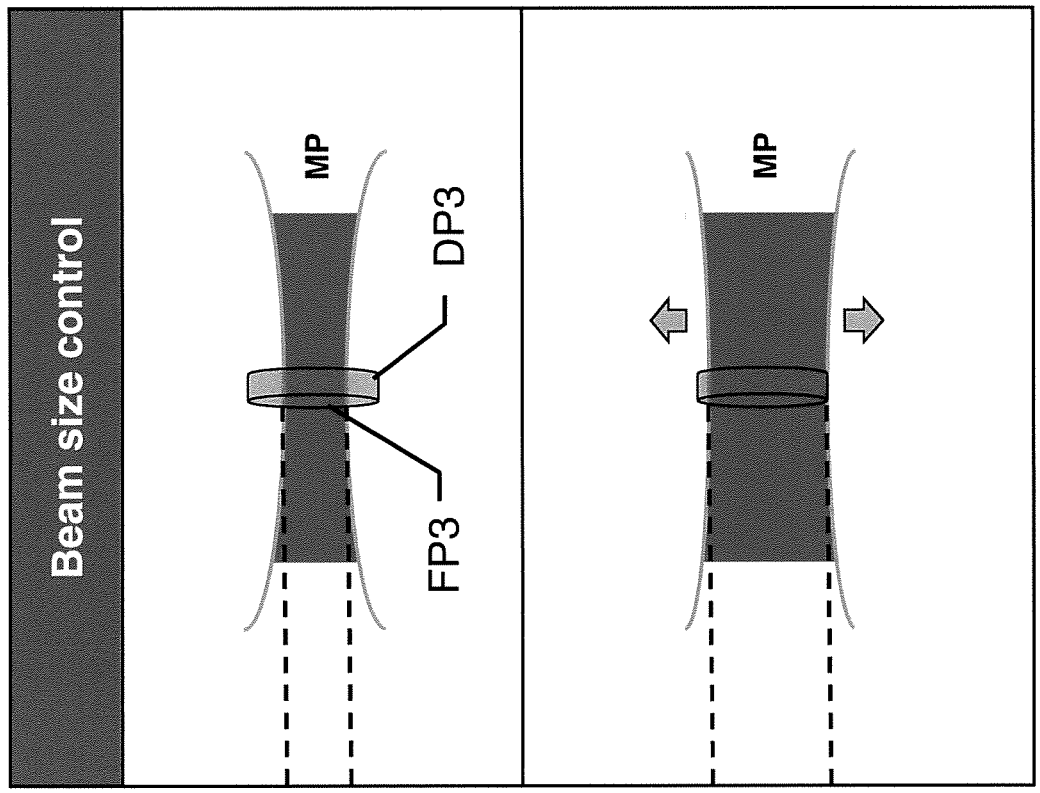
FIGS. 7A and 7B schematically illustrates a beam size that can be controlled by replacing one of the mirror in the light path of the excitation laser with a selectively detachable deformable mirror in accordance with an embodiment.

In some instances as shown in FIGS. 7A and 7B, the beam size 720 at a third focal point FP3 (which would ideally coincide with the zone of excitation) can be optimized. FIG. 7A shows the main pulse MP irradiating portions of the target droplet DP3. In FIG. 7B, the selectively detachable deformable mirror assembly 1500 changes the beam size of the main pulse MP from a first beam width 722 to a second beam width 724 allowing the main pulse MP to fully cover the target droplet DP3. The selectively detachable deformable mirror assembly 1500 can optimize the beam size 720 during in-line processing without stopping the EUV system.

In another embodiment shown in FIGS. 8A and 8B, the MPPPz (see FIG. 2F, the distance along the z-axis of the MPPP separation) is optimized by using the selectively detachable deformable mirror. In some instances as shown in FIGS. 8A and 8B, the MPPP separation in the optical axis 740 at a fourth focal point FP4 (which would ideally coincide with the zone of excitation) is optimized. FIG. 8A shows the main pulse MP irradiating a target droplet DP4 at a position misaligned with the fourth focal point FP4. The selectively detachable deformable mirror assembly 1500 can change the focal length of the main pulse MP from a first focal length 742 to a second focal length 744 allowing the main pulse MP to irradiate the target droplet DP3 at the fourth focal point FP4. The selectively detachable deformable mirror assembly 1500 can optimize the MPPP separation along the optical axis during in-line processing without stopping the EUV system.

Figures 9A, 9B:
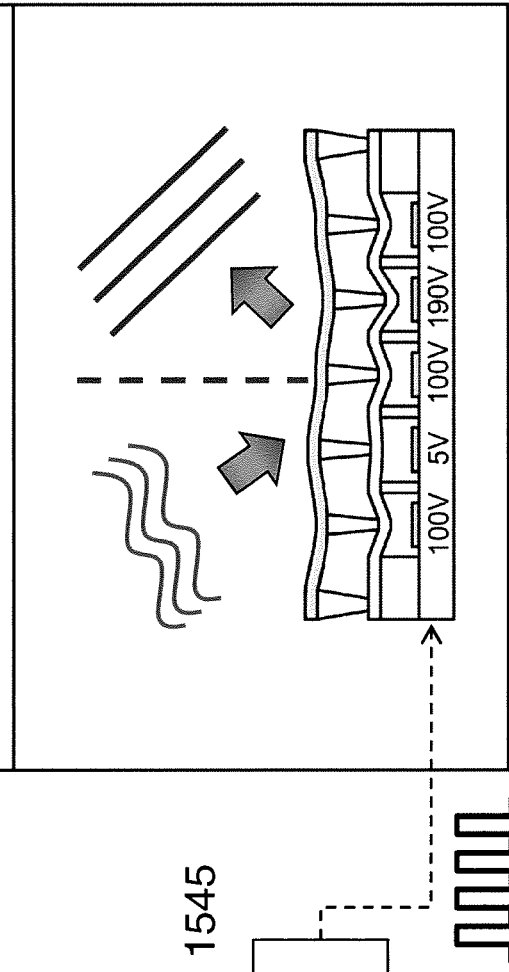
FIGS. 9A and 9B schematically illustrates a wavefront aberration correction that can be controlled by replacing one of the mirror in the light path of the excitation laser with a selectively detachable deformable mirror in accordance with an embodiment.

In yet another embodiment shown in FIGS. 9A and 9B, a deformed or distorted wavefront is corrected using the selectively detachable deformable mirror. If a variation in the wavefront aberration is less than a threshold value (e.g., 1%, 5% or 10%), none of the parameters are optimized. However, if the variation in the wavefront aberration is greater than the threshold value, one or more voltages of the DC bias circuit 1545 is optimized. In various embodiments, the determination of which voltages of the DC bias circuit 1545 is to be optimized is based on calibration data and/or historical data relating to the variation in wavefront aberration as a function of a variation in various parameters.

The selectively detachable deformable mirror, in various embodiments, is controlled using a feedback loop that uses, for example, a variation in EUV radiation as a feedback parameter. In another embodiment, position and/or trajectory of the target droplet as measured by a droplet detection module (DDM) is used as a feedback parameter for controlling the selectively detachable deformable mirror. In other embodiments, other parameters may be used depending on the desired outcome.

Figure 10A:
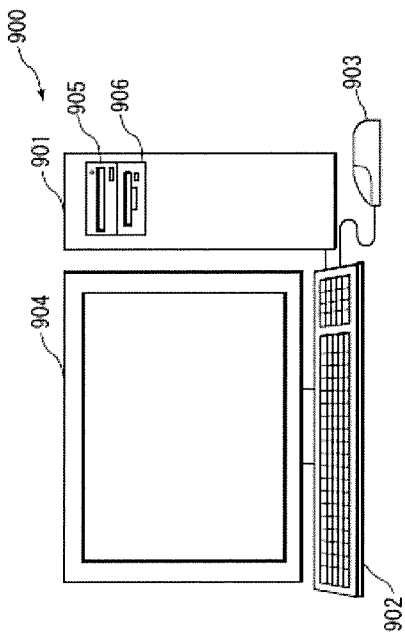
FIGS. 10A and 10B show an EUV data analyzing apparatus according to an embodiment of the present disclosure.
Figure 10B:
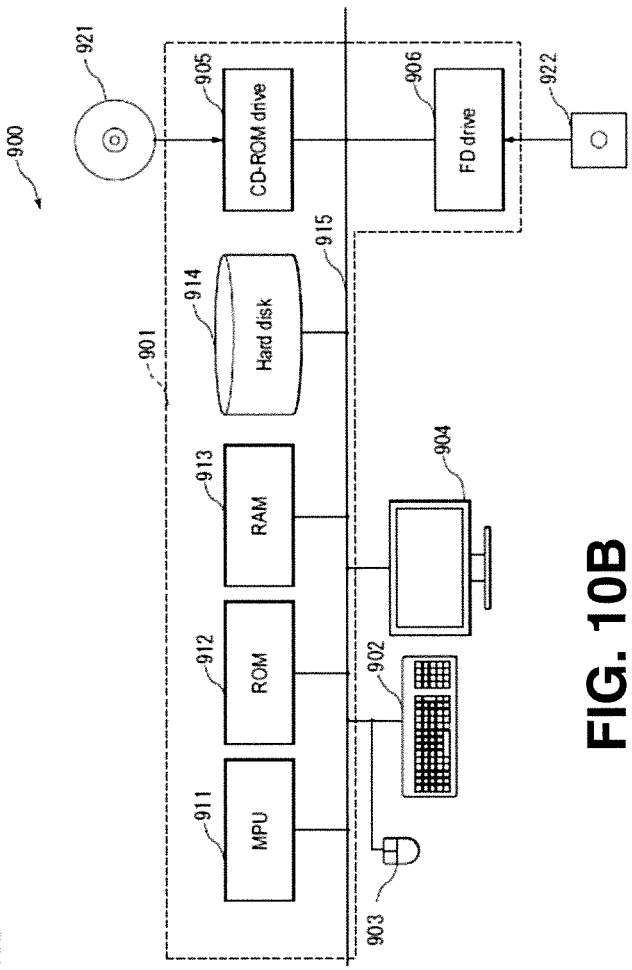

FIGS. 10A and 10B show a EUV data analyzing apparatus according to an embodiment of the present disclosure. FIG. 10A is a schematic view of a computer system that executes the in-line feedback/optimization process described above. The foregoing embodiments may be realized using computer hardware and computer programs executed thereon. In FIG. 10A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 10B is a diagram showing an internal configuration of the computer system 900. In FIG. 10B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the EUV data analyzing apparatus in the foregoing embodiments may be stored in an optical disk 921 or a magnetic disk 922, which are inserted into the optical disk drive 905 or the magnetic disk drive 906, and be transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the EUV data analyzing apparatus in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs. Furthermore, a computer that executes the programs may be a single computer or may be multiple computers.

Further, the entirety of or a part of the programs to realize the functions of the in-line feedback/optimization apparatus is a part of another program used for EUV parameter optimization processes in some embodiments. In addition, the entirety of or a part of the programs to realize the functions of the in-line feedback/optimization apparatus is realized by a ROM made of, for example, a semiconductor device in some embodiments.

Figure 11:
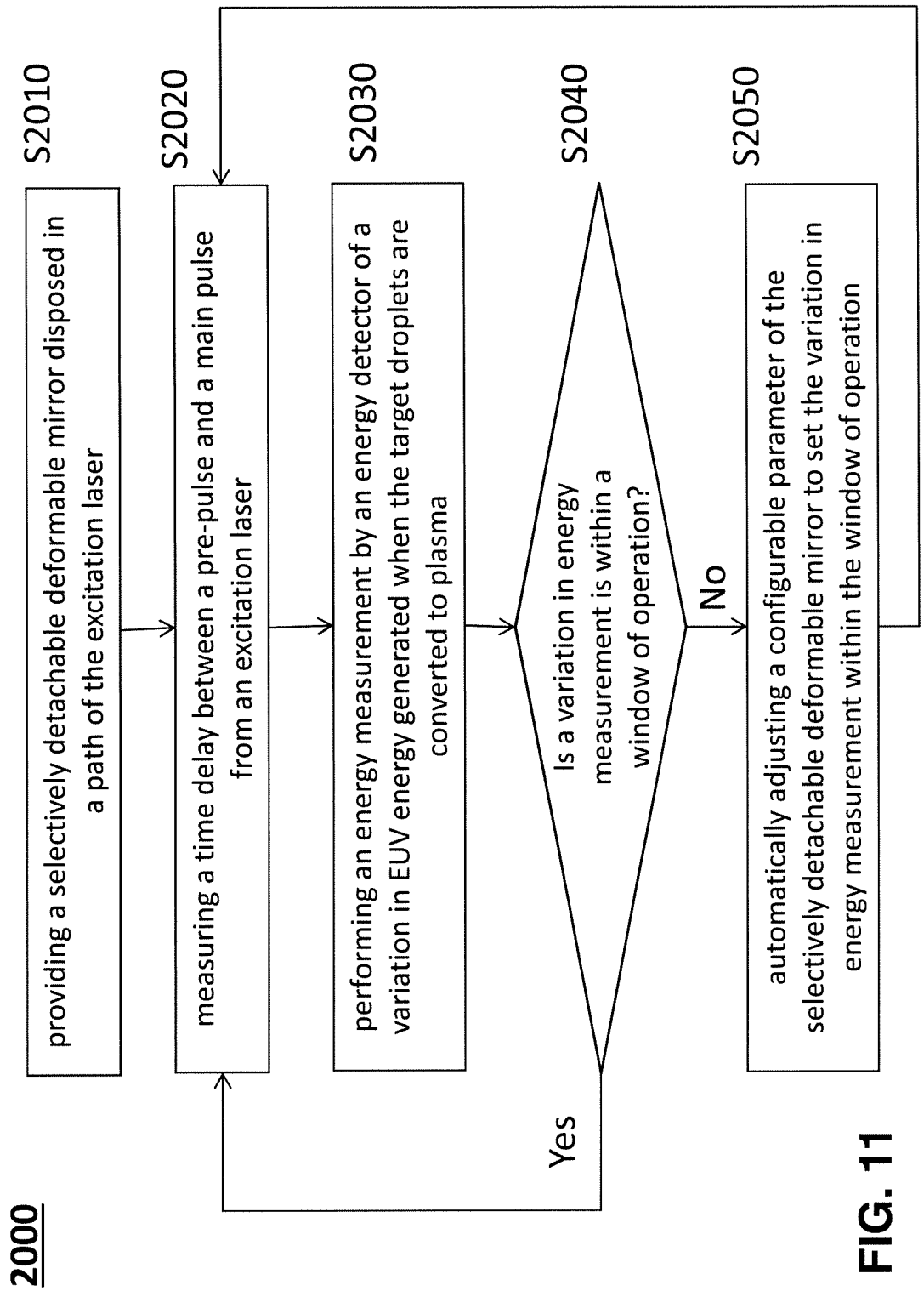
FIG. 11 illustrates a flow-chart of a method of controlling the selectively detachable deformable mirror in accordance with an embodiment of the present disclosure.

FIG. 11 illustrates a flow chart of a method 2000 of controlling the selectively detachable deformable mirror assembly 1500 with a feedback control loop, in accordance with an embodiment of the present disclosure. The method includes, at S2010, providing a selectively detachable deformable mirror disposed in a path of the excitation laser. One or more mirrors in the path of the excitation laser that can be replaced with the selectively detachable deformable mirror assembly 1500. At S2020, the method also includes measuring a time delay between a pre-pulse and a main pulse from an excitation laser. The target droplet reflects and/or scatters a portion of the main-pulse MP incident upon it. At S2030, the reflected and/or scattered light is detected, for example, by an energy detector. At S2040, it is determined whether a variation in energy measurement of the detected light (i.e., due to the relative position of the target droplet and the pre-pulse of the laser) is within the window of operation 410 shown in FIG. 3. In embodiments where the light is detected using a photodiode, the determination is based on a value of current and/or voltage produced by photodiode when a controller receives the relative position of the target droplet and the pre-pulse of the laser from the photodiode. In some embodiments, the energy detector includes a logic circuit programmed to generate a predetermined signal when the detected variation in energy measurement is not within the window of operation 410. If the variation in energy measurement of the detected light is not within the window of operation 410, at 52050, a configurable parameter of the selectively detachable deformable mirror assembly 1500 is automatically adjusted to increase or decrease the variation in energy measurement of the target droplet so as to ultimately bring the variation in energy measurement of the detected light within the window of operation 410.

The embodiments of the present disclosure provide increased tool availability for the EUV lithography system by enabling inline control instead of manual rearrangement of various components. Additionally, the use of a selectively detachable deformable mirror enables adjustment of the wavefront and correction of the optical aberration by providing a better optimized laser beam profile. By enabling optimal synchronization of the beam (pre-pulse and main pulse) with target droplets, dose error from variation in EUV energy is minimized, and conversion efficiency is improved, thereby improving the cost efficiency of the tool. Further because the selectively detachable deformable mirror enables correction to beam profile and/or beam path, it can be ensured that the entire target droplet is properly heated, thereby reducing tin contamination and increasing the lifetime of the collector mirror.

According to one aspect of the present disclosure, an apparatus for generating extreme ultraviolet (EUV) radiation comprises a droplet generator, an excitation laser, a selectively detachable deformable mirror, and a controller. The droplet generator is configured to generate target droplets. The excitation laser is configured to heat the target droplets using excitation pulses to convert the target droplets to plasma. The selectively detachable deformable mirror is disposed in a path of the excitation laser. The controller is configured to adjust parameters of the excitation laser by controlling the selectively detachable deformable mirror based on a feedback parameter. In some embodiments, the feedback parameter is selected from the group consisting of a variation in EUV energy generated from heating the target droplets, a position and/or trajectory of the target droplet, position of a focal point of the excitation laser, a time delay between a pre-pulse of the excitation laser and a main pulse of the excitation laser, laser power, time delay between successive pre-pulses, a time delay between successive main pulses, a width of the excitation at the focal point, and a combination thereof. In some embodiments, the controller is further configured to determine the parameter to be adjusted based on historical data relating to a variation in EUV energy as a function of a variation in the parameter. In some embodiments, the controller is also configured to control the selectively detachable deformable mirror to change the EUV wavefront of one of or both the pre-pulse and main pulse based on a variation in the wavefront profile generated by at least one preceding pulse. In some embodiments, the selectively detachable deformable mirror has a diameter in a range from about 13 cm to about 17 cm. In some embodiments, the selectively detachable deformable mirror is divided into isolated deformable regions. In some embodiments, each of the isolated deformable regions includes an adjustable tilt angle with respect an initial tilt angle in a range from −2.0 mrad to +2.0 mrad. In some embodiments, each of the isolated deformable regions is also controlled by a voltage in a range from about 1 Vdc to about 200 Vdc. In some embodiments, each of the isolated deformable regions is made of a piezo crystal.

According to another aspect of the present disclosure, a method of controlling a feedback system of an extreme ultraviolet (EUV) radiation source includes providing a selectively detachable deformable mirror disposed in a path of the excitation laser. The method includes measuring a time delay between a pre-pulse and a main pulse from an excitation laser. The method also includes performing an energy measurement by an energy detector of a variation in EUV energy generated when the target droplets are converted to plasma. Subsequently, the method includes determining whether a variation in energy measurement is within a window of operation. In response to a variation in energy measurement that is not within the window of operation of variation in energy measurement, the method includes automatically adjusting a configurable parameter of the selectively detachable deformable mirror to set the variation in energy measurement within the window of operation. In some embodiments, the energy measurement measures at least one of a beam size of the pre-pulse and the main-pulse and a spatial separation between the pre-pulse and the main-pulse. In some embodiments, the selectively detachable deformable mirror adjusts an adjustable tilt angle with respect an initial tilt angle in a range from −2.0 mrad to +2.0 mrad to each of the isolated deformable regions of the selectively detachable deformable mirror. In some embodiments, the selectively detachable deformable mirror also adjust a voltage in a range from about 1 Vdc to about 200 Vdc to the selectively detachable deformable mirror. In some embodiments, the method further includes modulating the amplitude of the voltage using the pulse timing. In some embodiments, the method further includes modulating a frequency of voltage pulses using the pulse timing module. In some embodiments, the feedback system generates a notification based on a new energy measurement information indicating the energy measurement is within the acceptable energy measurement range.

According to yet another aspect of the present disclosure, an apparatus for generating extreme ultraviolet (EUV) radiation includes a droplet generator, a beam transport system, a wavefront aberration detector, and a controller coupled to the wavefront aberration detector. The droplet generator is configured to generate target droplets. The beam transport system includes radiation source and a selectively detachable deformable mirror. The radiation source is configured to adjust a time delay between a pre-pulse and a main pulse at a predetermined position. The wavefront aberration detector is configured to measure a variation in EUV wavefront generated when the target droplets are converted to plasma by an excitation laser. The controller coupled to the wavefront aberration detector is programmed to determine whether the variation in wavefront measurement of radiation detected at the wavefront aberration detector is within a window of operation. In response to a determination that the detected variation in wavefront measurement is not within the window of operation, the controller automatically adjust a configurable parameter of the selectively detachable deformable mirror. In some embodiments, the controller is configured to generate a wavefront profile of one of or both the pre-pulse and main pulse. In some embodiments, the controller is also configured to control the selectively detachable deformable mirror to change the EUV wavefront of one of or both the pre-pulse and main pulse based on a variation in the wavefront profile generated by at least one preceding pulse. In some embodiments, the controller is further configured to determine the wavefront profile of one of or both the pre-pulse and main pulse to be adjusted based on historical data relating to a variation in EUV energy as a function of variation in the parameter.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for generating extreme ultraviolet (EUV) radiation, the apparatus comprising:
    a droplet generator configured to generate target droplets;
    an excitation laser configured to heat the target droplets using excitation pulses to convert the target droplets to plasma;
    a selectively deformable mirror disposed in a path of the excitation laser, the selectively deformable mirror comprises a plurality of regions that are selectively controlled to deform; and
    a controller configured to adjust parameters of the excitation laser including a beam size of a pre-pulse and a main pulse of the excitation laser by controlling the selectively deformable mirror based on a feedback parameter comprising a spatial separation between a pre-pulse of the excitation laser and a main pulse of the excitation laser.

2. The apparatus of claim 1, wherein the feedback parameter is further comprises at least one selected from the group consisting of a variation in an excitation laser energy used to heat the target droplets, a position and/or trajectory of the target droplet, position of a focal point of the excitation laser, a time delay between the pre-pulse of the excitation laser and the main pulse of the excitation laser, laser power, time delay between successive pre-pulses, a time delay between successive main pulses, and a width of the excitation at the focal point.

3. The apparatus of claim 1, wherein the controller is further configured to determine the parameter to be adjusted based on historical data relating to a variation in an excitation laser energy as a function of a variation in the parameter.

4. The apparatus of claim 1, wherein the controller is configured to control the selectively deformable mirror to change an excitation laser wavefront of one of or both the pre-pulse and the main pulse based on a variation in an excitation laser wavefront profile generated by at least one preceding pulse.

5. The apparatus of claim 1, wherein the selectively deformable mirror has a diameter in a range from about 13 cm to about 17 cm.

6. The apparatus of claim 1, wherein the plurality of regions of the selectively deformable mirror comprise divided into isolated deformable regions.

7. The apparatus of claim 6, wherein each of the divided isolated deformable regions includes an adjustable tilt angle with respect an initial tilt angle in a range from −2.0 mrad to +2.0 mrad.

8. The apparatus of claim 7, wherein each of the divided isolated deformable regions is made of a piezo crystal.

9. The apparatus of claim 6, wherein each of the divided isolated deformable regions is controlled by a voltage in a range from about 1 Vdc to about 200 Vdc.

10. A method of controlling a feedback system of an extreme ultraviolet (EUV) radiation source, the method comprising:
    providing a selectively deformable mirror disposed in a path of an excitation laser, the selectively deformable mirror comprises a plurality of regions that are selectively controlled to deform;
    measuring a time delay between a pre-pulse and a main pulse from an excitation laser;
    performing an energy measurement by an energy detector of a variation in an excitation laser energy used to convert target droplets to plasma, wherein the energy measurement includes a beam size of the pre-pulse and the main pulse of the excitation laser;

determining whether a variation in energy measurement is within a window of operation; and in response to a variation in energy measurement that is not within the window of operation of the variation in energy measurement, automatically adjusting a configurable parameter of the selectively deformable mirror to set the variation in energy measurement within the window of operation, wherein the performing the energy measurement includes measuring a spatial separation between the pre-pulse and the main pulse.

11. The method according to claim 10, wherein the plurality of regions of the selectively deformable mirror comprise divided isolated deformable regions.

12. The method of claim 11, wherein the automatically adjusting the configurable parameter of the selectively deformable mirror includes adjusting an adjustable tilt angle with respect an initial tilt angle in a range from −2.0 mrad to +2.0 mrad to each of the divided isolated deformable regions of the selectively deformable mirror.

13. The method of claim 12, further comprising modulating an amplitude of a voltage using the pulse timing module.

14. The method of claim 12, further comprising modulating a frequency of voltage pulses using the pulse timing module.

15. The method of claim 10, wherein automatically adjusting a configurable parameter of the selectively deformable mirror includes adjusting a voltage in a range from about 1 Vdc to about 200 Vdc to the selectively deformable mirror.

16. The method according to claim 10, further comprising generating, by the feedback system, a notification based on a new energy measurement information indicating the energy measurement is within the acceptable energy measurement range.

17. An apparatus for generating extreme ultraviolet (EUV) radiation comprising:

a droplet generator configured to generate target droplets;

a beam transport system comprising:

a radiation source configured to adjust a time delay between a pre-pulse and a main pulse at a predetermined position, and a selectively deformable mirror, the selectively deformable mirror comprises a plurality of regions that are selectively controlled to deform;

a wavefront aberration detector configured to measure a variation in an excitation laser wavefront used to convert target droplets to plasma; and a controller coupled to the wavefront aberration detector and programmed to:

determine whether the variation in wavefront measurement of radiation detected at the wavefront aberration detector is within a window of operation, and automatically adjust, in response to a determination that the detected variation in wavefront measurement is not within the window of operation, a configurable parameter of the selectively deformable mirror, wherein the controller is further configured to automatically adjust the configurable parameter based on a spatial separation between the pre-pulse and the main pulse.

18. The apparatus of claim 17, wherein the controller is configured to generate an excitation laser wavefront profile of one of or both the pre-pulse and the main pulse.

19. The apparatus of claim 18, wherein the controller is configured to control the selectively deformable mirror to change the excitation laser wavefront of one of or both the pre-pulse and main pulse based on a variation in the excitation laser wavefront profile generated by at least one preceding pulse.

20. The apparatus of claim 18, the controller is further configured to determine the excitation laser wavefront profile of one of or both the pre-pulse and main pulse to be adjusted based on historical data relating to a variation in the excitation laser as a function of variation in the parameter.

* * * * *